United States Patent [19]

Deppe et al.

[11] Patent Number: 5,034,743
[45] Date of Patent: Jul. 23, 1991

[54] AC ENCODED SIGNAL TO DIGITAL CONVERTER

[75] Inventors: James G. Deppe, Aurora; Joseph R. Biel, Wheaton, both of Ill.

[73] Assignee: Flight Visions Incorporated, Sugar Grove, Ill.

[21] Appl. No.: 390,585

[22] Filed: Aug. 7, 1989

[51] Int. Cl.$^5$ .............................................. H03M 1/64
[52] U.S. Cl. ........................................ 341/116; 341/112
[58] Field of Search ............... 341/115, 116, 112, 111, 341/113, 115, 155; 318/661, 632; 364/602

[56] References Cited

U.S. PATENT DOCUMENTS

| | | |
|---|---|---|
| 3,092,718 | 6/1963 | Wullert . |
| 3,618,073 | 11/1971 | Domchick et al. ................. 341/116 |
| 3,990,062 | 11/1976 | Miller et al. . |
| 4,017,846 | 4/1977 | Aramaki ............................. 341/116 |
| 4,149,260 | 4/1979 | Loper, Jr. . |
| 4,204,257 | 5/1980 | Hungerford . |
| 4,340,881 | 7/1982 | Stack et al. . |
| 4,352,050 | 9/1982 | Sakano ............................... 341/116 |
| 4,375,636 | 3/1983 | Stack et al. . |
| 4,468,745 | 8/1984 | Kjosavik ............................ 341/116 |
| 4,493,091 | 1/1985 | Gundry .............................. 341/126 |
| 4,591,831 | 5/1986 | D'Anci . |
| 4,794,511 | 12/1988 | Lundin . |
| 4,890,105 | 12/1989 | Bean et al. ......................... 341/116 |

OTHER PUBLICATIONS

"Synchro and Resolver to Digital Converters", ILC Data Device Corp. Data Sheets, pp. E3–E51.
"Balanced Modulator/Demodulator", *Analog Devices*, Data Sheet for Model No. AD630, pp. 1–8, C784a-2-7/84.

*Primary Examiner*—J. R. Scott
*Assistant Examiner*—B. K. Young
*Attorney, Agent, or Firm*—Welsh & Katz, Ltd.

[57] ABSTRACT

An ac encoded signal to digital converter suitable for converting ac synchro or resolver signals to a corresponding digital angle value. A synchronous demodulator including a high pass input filter and low pass output filter utilizes the associated reference excitation signal to convert the individual ac encoded signals to corresponding dc values. The absolute value of the dc values are proportional to the amplitude of each of the respective ac encoded signals, but the dc value is negative if the ac encoded signal is 180° out of phase with the reference excitation signal. These dc values are subsequently digitized and digitally processed based on their trigonometric relationship to extract the encoded angular position value.

18 Claims, 4 Drawing Sheets

AC ENCODED SIGNAL TO DIGITAL CONVERTER

The present invention relates generally to the field of analog to digital conversion and more particularly to novel method and circuitry for converting analog ac encoded signals such as synchro and resolver signals into corresponding digital values.

Ac synchros are widely utilized in the prior art to sense the actual angular position of a shaft or other mechanical device, such as the shaft of an aircraft instrument. The synchro angle information resides in the relative magnitude and phase between three line to line synchro stator voltages. The rotary winding of each synchro stator is energized with a known magnitude, known frequency ac reference signal. The three synchro voltages $S_1$, $S_2$, and $S_3$ are induced in the three stator windings. The amplitude of the voltage signals induced in each of the synchro stator windings is dependent upon the turns ratio between the rotor and stator and on the synchro position angle ($\alpha$), e.g., the instrument shaft position angle. By comparing the amplitude and relative phase of the voltage induced in each of the three stator winding pairs, the value of $\alpha$ is uniquely determined.

Typically, the stator winding voltages are compared to provide differential signals representative of the voltage between each of the two stator windings. Thus, if $\cos \phi t$ is the synchro reference signal, the three possible pairs are related as $V_1 - V_3 = V_m \sin\alpha \cos \phi t$; $V_3 - V_2 = V_m \sin(\alpha + 120°) \cdot \cos \phi t$; $V_2 - V_1 = V_m \sin(\alpha + 240°) \cdot \cos \phi t$. Thus, the differential synchro signals are sinusoids at the same frequency as the synchro reference ac signal, but with an amplitude which is modulated in dependence upon the value of the synchro angle $\alpha$. This is one of a number of techniques for encoding angular position information in a set of ac encoded signals.

In prior art synchro signal to digital converters, the three synchro signals are converted by precision Scott T transformer to a resolver format which constitutes two output voltages whose amplitudes are proportional to the sine and the cosine of the synchro angle $\alpha$ (i.e., $\sin\alpha \cos\phi t$; $\cos\alpha \cos\phi t$). The sine and cosine resolver signals are then processed using one of a number of known techniques to extract the angle value. One prior art technique includes phase shifting the sine and cosine signals by known opposite phase shift values. The difference magnitude between the two phase shifted signals is representative of the synchro angle value, and is obtained by converting the phase shifted signal to a pulse width modulated signal with a duty cycle dependent on the difference signal magnitude. The pulse width modulated signal is converted into digital word by counting the number of known frequency clock pulses within the on portion of the pulse width modulated signal. The total count value is directly proportional to the synchro angle value, and may be read directly as a digital word.

An alternative method is to ratio the sine and cosine signals into a tangent or cotangent equivalent, which is converted to a digital signal equivalent and then processed to generate a synchro angle value. Another approach uses a successive approximation method to convert the sine and cosine signals to a digital angle value using hybrid circuitry. One prior art technique avoids the use of a Scott T network by obtaining a digital representation of the ratio of the smaller of the difference signal magnitudes between each of two stator winding voltage signals and a third stator winding voltage selected as a reference, divided by the larger. Then, based on the range of the synchro angle value, a signal processor processes the digital ratio signal and the angle range to determine the synchro angle value.

These prior art techniques make use of complex circuitry typically requiring a Scott T network or transformer and precision circuitry resulting in complex hybrid circuits which are both expensive and bulky. Further, existing data acquisition systems typically utilize conventional analog to digital (A/D) converters in combination with a signal processor to handle all of the various types of input signals in a system. Thus, such systems have existing A/D converters and digital processors which can be used to convert synchro and resolver signals but which are not fully utilized by existing prior art systems.

It is accordingly an object of the present invention to provide a novel analog to digital converter for converting encoded ac signals such as resolver and synchro signals to a digital representation of the encoded angle while eliminating the use of Scott T networks.

It is another object of the invention to provide a novel encoded ac signal to digital converter which reduces cost, size and weight and take advantage of existing system A/D conversion and signal processing capabilities.

It is yet another object of the invention to provide an encoded ac signal to digital converter in which synchronous demodulation is used to convert the ac signals to corresponding dc values which are then digitized and digitally processed to extract the encoded angular position value.

Accordingly, in accordance with one embodiment of the invention, there is provided an ac encoded signal to digital converter for converting to digital angular position value an encoded analog signal comprising at least two ac signals related in amplitude and phase to an associated angular position and a reference ac signal. The converter includes a demodulator responsive to the ac signals for demodulating each ac signal to thereby generate a corresponding dc voltage representative of the magnitude and phase relative to the reference signal for each respective ac signal. An analog to digital converter is then used to digitize each of the corresponding dc voltages to produce respective digital values and a digital processor is then utilized for processing the digital values to obtain a corresponding digital angular position value. Alternate embodiments are provided to convert synchro signals or resolver signals to digital angular position values.

BRIEF DESCRIPTION OF THE DRAWINGS

The invention, together with further objects and advantages thereof, may be understood by reference to the following detailed description taken in conjunction with the accompanying drawings.

DETAILED DESCRIPTION OF THE PREFERRED EMBODIMENT

Figure 1:
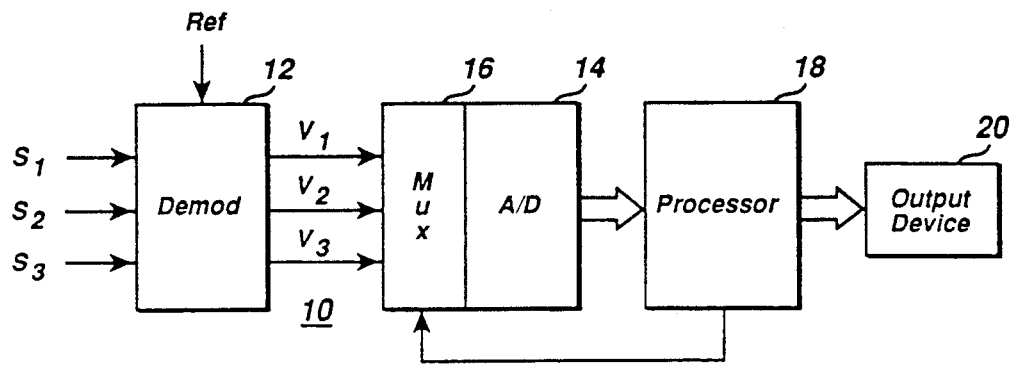
FIG. 1 is a block diagram of a specific embodiment of an ac encoded signal to digital converter in accordance with the invention.

Referring now to FIG. 1, there is shown a specific embodiment of an ac encoded signal to digital converter 10 suitable for converting ac resolver or ac synchro signals to the encoded position angle value in digital form. In case of an ac synchro signal, three synchro signals, $S_1$, $S_2$, $S_3$, are coupled, as shown, to a demodulator circuit 12. The three synchro signals encode an angle over a range of 0° to 360° by modulation of the amplitude of the three signals with the modulation being dependent upon the position angle $\alpha$. The three synchro signals and the reference signal are coupled to the demodulator 12 which generates a dc voltage for each of the three input signals which is directly proportional to the magnitude of the corresponding input signal, and which is negative if the phase is 180° out of phase with the reference signal. Thus, the demodulator 12 comprises a synchronous amplitude demodulator.

The demodulator 12 also provides filtering so that the output dc values, $V_1$, $V_2$, $V_3$, corresponding respectively to the input signals $S_1$, $S_2$, $S_3$ may then be coupled to an A/D converter 14 including an analog multiplexer 16, as shown. The analog multiplexer 16 couples each of the three dc signals, $V_1$, $V_2$, $V_3$, to the A/D converter 14 under control of a processor 18. The A/D converter converts the dc values to a digital value which is coupled as shown to the processor 18. Processor 18 is programmed to process the three synchro signals that are coupled in digital form to extract the encoded angle value. The processor 18 may also perform other functions if desired or may be a dedicated special purpose processor. The entire system of FIG. 1 may be integrated as a single monolithic integrated circuit requiring only the addition of external capacitors.

The resulting digital angular value is appropriately formatted by the processor 18 and output to an output device 20 which may be a CRT display, LCD display, printer, or other output device. In the case of a resolver signal in which there are only two ac signals and an ac reference, the circuitry functions in exactly the same manner except there are only two input signals, i.e., $S_1$, $S_2$, and consequently only two dc voltage values generated by the demodulator 12, i.e., $V_1$, $V_2$ The microprocessor program is accordingly modified to convert the two digitized resolver signals to a digital angular value.

Figure 2:
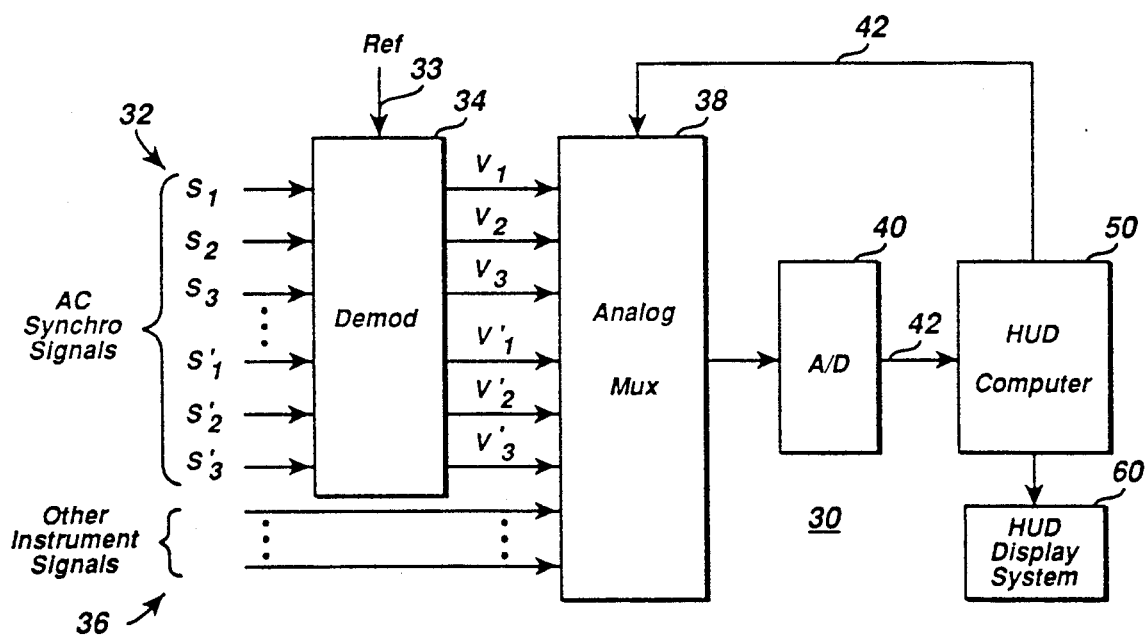
FIG. 2 is a block diagram of an alternative embodiment of an ac encoded signal to digital converter in accordance with the invention.

FIG. 2 illustrates an alternative embodiment in which an existing data acquisition system 30 provides the analog to digital conversion and processing capability. Virtually any acquisition system comprising an A/D converter and processing capability sufficient to process digital data using trigonometric functions can provide the conversion and processing capability suitable to practice the invention. The illustrated embodiment comprises a head-up display (HUD) system 30 wherein a variety of aircraft instrument readings are acquired and displayed on a head-up display in front of the pilot. Many of the instrument readings of aircraft instruments have traditionally been rotational display instruments which are encoded as synchro signals, while some are in other formats. Thus, as shown in FIG. 2, sets of ac synchro signals 32 from various instruments are coupled to demodulator circuits 34 along with a synchro reference signal 33. The demodulator circuits 34 convert each set of synchro signals ($S_1$, $S_2$, $S_3$) to three corresponding dc values ($V_1$, $V_2$, $V_3$), each of which is proportional to the amplitude of each corresponding synchro signal and each of which is negative whenever it is 180° out of phase with the synchro reference signal 33.

The corresponding dc values ($V_1$, $V_2$, $V_3$), as well as other analog inputs 36 are coupled, as shown, to an analog multiplexer 38. A select signal is coupled to the analog multiplexer 38 via a line 42 from a HUD processing computer 50, which in the illustrated embodiment may comprise a microprocessor (e.g., a Motorola 68000), to permit input selection by the computer 50, as shown. Thus, under control of the computer 50, the multiplexer 38 selectively couples each analog input to an A/D converter 40 (e.g., a model AD574 marketed by Analog Devices). The A/D converter 40 converts the analog input to digital data which is then coupled from the output 42 to the processor 50 and is temporarily stored by the processor 50. The processor 50 may include random access memory (RAM) for temporary storage and read only memory (ROM) for permanent storage of program instructions and program data. The digital data from the A/D converter 40 is then processed using the stored program to obtain the desired form of the digital data which is then coupled to a display system 60 for display. In the illustrated embodiment, the display system 60 comprises a CRT display optically coupled to a head-up display combiner (not shown).

In the illustrated embodiment, when a synchroencoded instrument is selected, the dc signals ($V_1$, $V_2$, $V_3$) are coupled to the A/D converter 40 and the resulting digital signals are coupled to the processor 50. Using trigonometric relationships between the signals $V_1$, $V_2$, $V_3$, the programmed processor determines the angular position value corresponding to the values of $V_1$, $V_2$, and $V_3$. In this manner, a simple converter comprising the demodulator circuitry 34 can be used to convert the ac synchro signals to a form which permits processing by an A/D converter and processor which otherwise exist in a system. This permits reduced cost, weight, volume, and power usage by the circuit while retaining high reliability and making use of existing processing capability. If a resolver encoded signal is to be processed, only two inputs ($S_1$, $S_2$) are required to be demodulated, and the processing method is modified to process resolver signals $V_1$ and $V_2$, as described in detail hereinafter.

Figure 3:
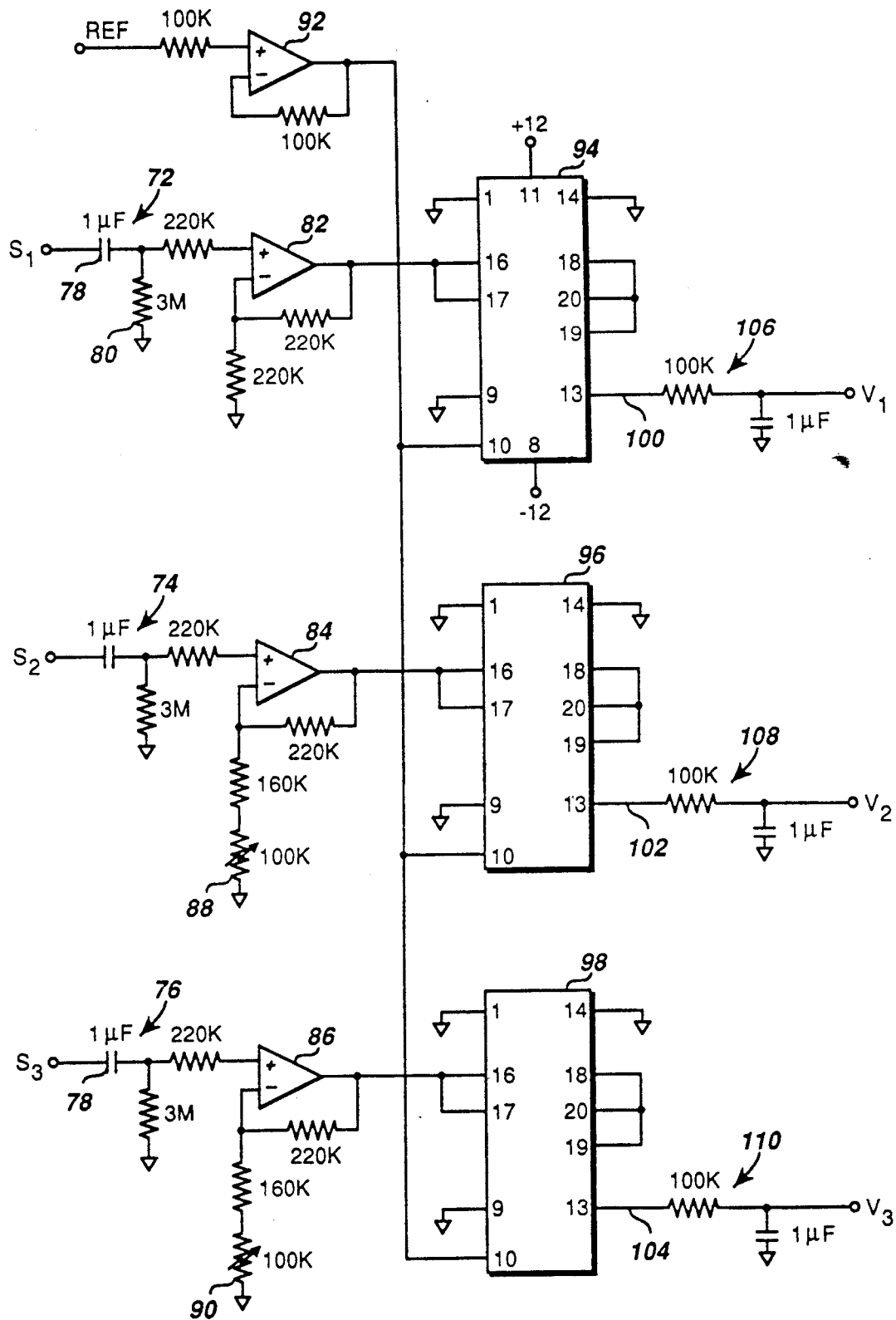
FIG. 3 is a detailed circuit schematic of a specific embodiment of a synchro signal demodulator circuit in accordance with the invention.

Referring now to FIG. 3, there is shown a detailed schematic diagram of the demodulator circuit 12 or a demodulator of the circuitry 34 for each set of synchro signals. The three ac synchro signals, $S_1$, $S_2$, $S_3$ are coupled respectively to the inputs of three identical high pass filters 72, 74, 76, as shown. The high pass filter 72, representative of all three filters, comprises a capacitor 78 (e.g., 1 $\mu f$) and a resistor 80 (e.g., 3 M$\Omega$) configured as shown. The high pass filters remove any dc component of the input signal and couple a respective ac synchro signal to the input of a respective amplifier 82, 84, 86, each configured to provide an identical gain of two in the illustrated embodiment. Each amplifier 82, 84, 86 comprises a conventional operational amplifier (e.g., a TL074 marketed by Texas Instruments) and a resistor network (e.g., each resistor or resistor/pot combination approximately 220 kΩ) configured to provide a gain of two for each amplifier in the illustrated embodiment. Two of the three amplifiers 84, 86 include trimmer resistors 88, 90 to permit matching of the gain of all three amplifiers. Each filter/amp combination provides a high input impedance.

An additional high input impedance amplifier 92 (e.g., an TL074) is provided to amplify the reference signal which is then coupled directly to a reference signal input to each of three demodulators 94, 96, 98 (e.g., an AD630 marketed by Analog Devices), as shown. In addition, the outputs of each of the amplifiers 82, 84, 86 are coupled respectively to an input of a respective demodulator 94, 96, 98. The demodulators 94, 96, 98 are configured in known manner to function as synchronous amplitude demodulators so as to produce an output signal at each respective output port 100, 102, 104. This output signal is a full wave rectified version of the input ac signal inverted if the input ac signal is 180° out of phase with the reference. These rectified signals are then coupled through a respective low pass filter 106, 108, 110 to remove any ripple and provide a dc voltage, the absolute value of which is proportional to the amplitude of the input ac signal.

The resulting signal at the outputs of the low pass filters 106, 108, 110 is a dc value proportional to the amplitude of the input signal but negative if the input ac is 180° out of phase with the reference signal. This resulting dc voltage ($V_1$, $V_2$, $V_3$) is then coupled to the A/D converter and used by the processor to determine the corresponding synchro angle $\alpha$. If resolver signals are to be converted, only two input signals, $S_1$, $S_2$, need to be converted using only two demodulator circuits. The resulting two dc voltages, $V_1$, $V_2$, are used by the processor to determine the encoded angle.

Figure 4:
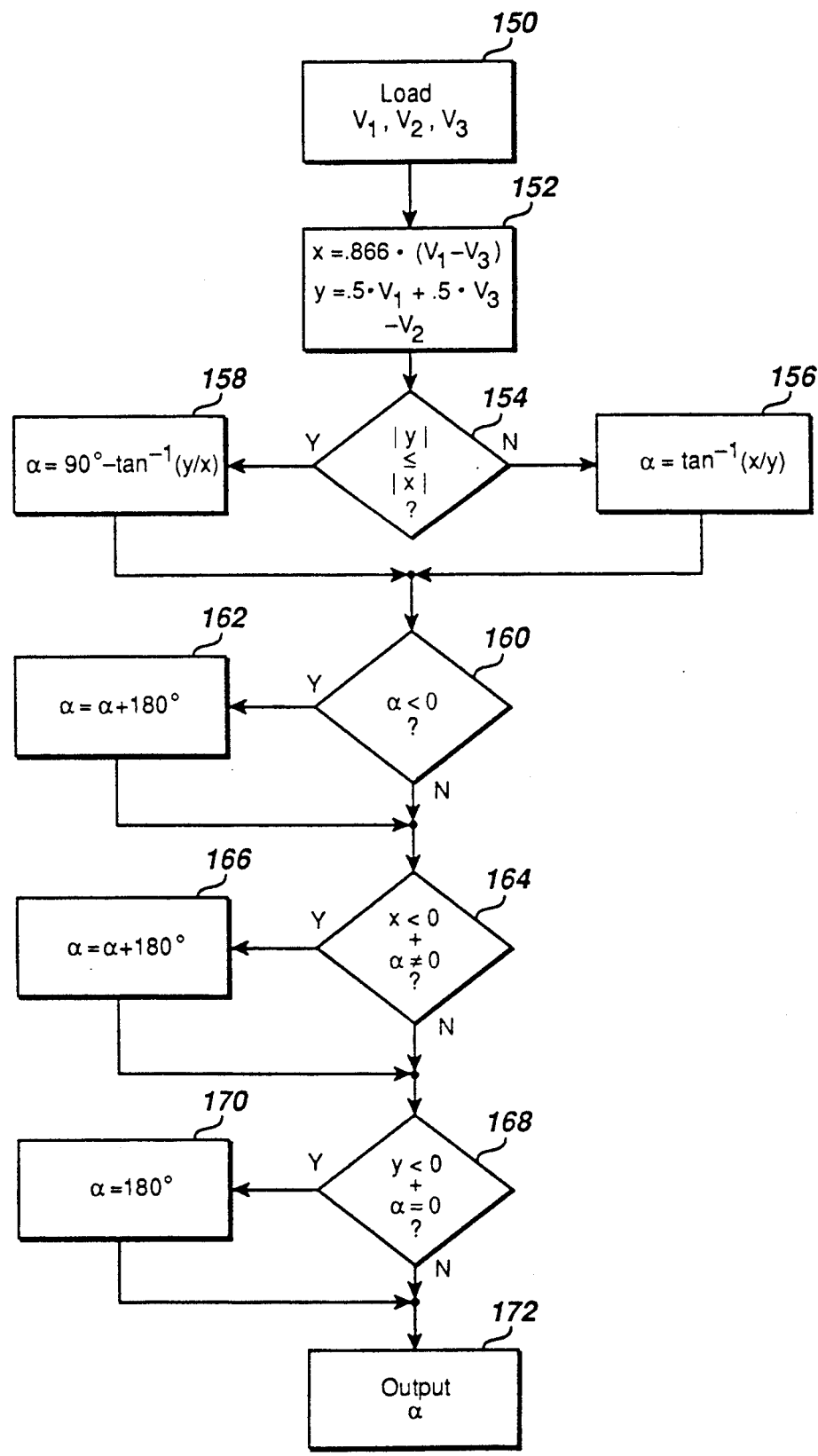
FIG. 4 is a flow diagram of a specific embodiment of the processing methodology for the signal processor illustrated in FIGS. 1 and 2 for processing synchro signals.

The digitized dc synchro values ($V_1$, $V_2$, $V_3$) are processed by the processor to determine in digital form the encoded synchro angular value $\alpha$. FIG. 4 is a block diagram illustrating a specific example of the methodology for determining the encoded angular position value from the three dc synchro signals $V_1$, $V_2$, $V_3$. As illustrated by block 150, the digitized values of $V_1$, $V_2$, and $V_3$ are first loaded by the processor. Values of x and y are then calculated based upon the relationship $x = .866 (V_1 - V_2)$ and $y = .5 \cdot V_1 + .5 \cdot V_3 - V_2$, as illustrated at block 152. Each of these equations is derived based on the trigonometric relationship between $V_1$, $V_2$, and $V_3$. A decision is subsequently performed at block 154 to determine if the absolute value of y is less than or equal to the absolute value of x, and if the result is negative, the position angle value $\alpha$ is set equal to $\tan^{-1}(x/y)$, as shown at block 156, while if the result is affirmative, the angle value $\alpha$ is set equal to $90° \tan^{-1}(y/x)$, as illustrated at block 158. In either event, program control continues to a decision block 160 where a decision is performed to determine whether $\alpha$ is less than zero. If the result is affirmative, $\alpha$ is set equal to $\alpha + 180°$, as shown at block 162, and if the result is negative, program control proceeds to decision block 164, as shown to determine if x is less than zero and $\alpha$ is not equal to zero. If both conditions are true, $\alpha$ is set equal to $\alpha + 180°$, as shown at block 166, and if not, program flow proceeds directly to decision block 168 to determine if y is less than zero and $\alpha$ is equal to zero. If the result is affirmative, $\alpha$ is set equal to 180°, as illustrated by block 170, and if the result is negative, $\alpha$ is not changed. The routine is subsequently exited with the output of the digital angle value $\alpha$ as illustrated at block 172.

Figure 5:
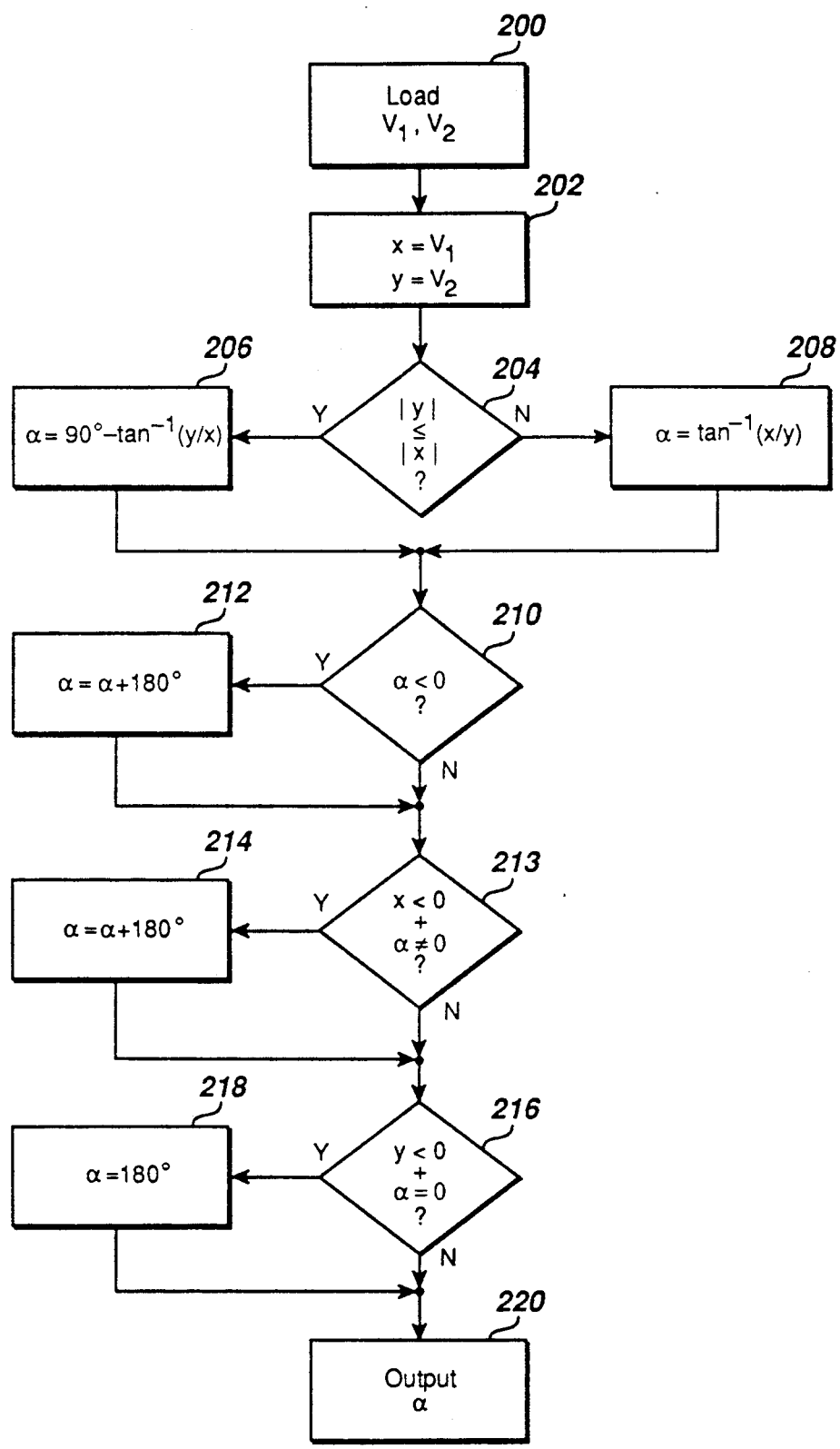
FIG. 5 is a detailed flow diagram of a specific embodiment of the processing methodology for the processors shown in FIGS. 1 and 2 for a resolver converter in accordance with the invention.

Referring now to FIG. 5, there is shown a block diagram illustrating a specific example of the program methodology for determining the encoded angular position value from the two dc resolver signals $V_1$, $V_2$. As illustrated at block 200, the digitized values of $V_1$, $V_2$ are first loaded by the processor after which values of x and y are calculated according to the relationships, $x = V_1$ and $y = V_2$, as illustrated at block 202. A decision is subsequently performed at block 204 to determine if the absolute value of y is less than or equal to the absolute value of x, and if the result is negative, the position angle value is set equal to $\tan^{-1}(x/y)$, as shown at block 206, while if the result is affirmative, the angle value $\alpha$ is set equal to $90° - \tan^{-1}(y/x)$, as illustrated at block 208. In either event, program control continues to a decision block 210 where a decision is performed to determine whether $\alpha$ is less than zero. If the result if affirmative, $\alpha$ is set equal to $\alpha + 180°$, as shown at block 212 and if the result is negative, program control proceeds directly to decision block 213 to determine if x is less than zero and $\alpha$ is not equal to zero. If both conditions are true, $\alpha$ is set equal to $\alpha + 180°$, as shown at block 214, and if not, program flow proceeds directly to decision block 216 to determine if y is less than zero and $\alpha$ is equal to zero. If the result is affirmative, $\alpha$ is set equal to 180°, as illustrated by block 218, and if the result is negative, $\alpha$ is not changed. The routine is subsequently exited with the output of the digital angle value $\alpha$, as illustrated at block 220.

Specific embodiments of the novel ac encoded signal to digital converter according to the invention have been described for the purpose of illustrating the manner in which the invention may be made and used. It should be understood that implementation of other variations and modifications of the invention in its various aspects will be apparent to those skilled in the art, and that the invention is not limited by the specific embodiments described. It is therefore contemplated to cover by the present invention any and all modifications, variations or equivalent that fall within the true spirit and scope of the basic underlying principles disclosed and claimed herein.

What is claimed is:

1. An analog ac encoded signal to digital converter for converting to a digital angular position value an encoded analog signal comprising at least two ac signals whose amplitude and phase relative to a reference ac signal are dependent upon an associated angular position, comprising:

demodulator circuitry responsive to the ac signals for demodulating each ac signal to thereby generate for each respective ac signal a corresponding dc voltage representative of the magnitude and phase relative to the reference signal of the respective ac signal;

analog to digital converter for digitizing each of the corresponding dc voltages to produce respective digital values; and a programmed microprocessor for processing the digital values to obtain a corresponding digital angular position value.

2. The converter of claim 1 wherein the encoded signal is a synchro signal comprising three ac synchro signals.

3. The converter of claim 1 wherein the encoded signal is a resolver signal comprising two ac resolver signals.

4. The converter of claim 1 wherein the demodulator circuitry comprises a synchronous demodulator for each of the ac signals, each demodulator utilizing the reference signal as a synchronization reference signal.

5. The converter of claim 4 wherein the demodulator circuitry further comprises a high pass filter coupled to the synchronous demodulator to filter the ac signals prior to demodulation.

6. The converter of claim 5 wherein the demodulator circuitry further comprises a low pass filter coupled to the synchronous demodulator and to the analog to digital converter to filter each corresponding dc voltage prior to digitization.

7. The converter of claim 4 wherein each synchronous demodulator comprises means for rectifying the respective ac signal to generate a rectified signal and means for inverting the rectified signal when the ac signal is more than 180° out of phase with the reference ac signal.

8. The converter of claim 1 further comprising an analog multiplexer coupled to the demodulator circuitry and to the analog to digital converter to permit selective coupling of all the corresponding dc voltages from the demodulator circuitry to the analog to digital converter.

9. An ac encoded signal converter, for use in a data acquisition system utilizing an analog to digital converter for digitizing analog signals and a processor capable of processing the digitized signals, to convert at least two ac encoded analog signals which are related in amplitude and phase to a reference ac signal in dependence upon an angular position, comprising:
   input means for inputting of the ac encoded analog signals;
   a synchronous demodulator for each of the ac encoded analog signals, each demodulator utilizing the reference ac signal as a synchronization reference signal and each demodulator responsive to the ac encoded analog signals for demodulating the ac encoded signals to generate for each respective ac encoded analog signal a corresponding dc voltage representative of the magnitude and phase relative to the reference signal of the respective ac encoded signal and wherein a high pass filter is coupled to each synchronous demodulator to filter the ac encoded analog signals prior to demodulation; and
   means for coupling each of the corresponding dc voltages to the analog to digital converter.

10. The converter of claim 9 wherein the ac encoded analog signals comprise three ac synchro signals.

11. The converter of claim 9 wherein the ac encoded analog signals comprise two resolver signals.

12. The converter of claim 9 wherein the demodulator means further comprises a low pass filter coupled to the synchronous demodulator and the means for coupling to filter each corresponding dc voltage prior to coupling to the analog to digital converter.

13. The converter of claim 9 wherein each synchronous demodulator comprises means for rectifying the respective ac encoded analog signal to generate a rectified signal and means for inverting the rectified signal when the ac encoded analog signal if 180° out of phase with the reference ac signal.

14. A method of converting an ac encoded analog signal to a digital angular position value wherein the ac encoded analog signal comprises at least two ac signals related in amplitude and phase to an associated angular position and to a reference ac signal, comprising the steps of:
   high pass filtering of each ac signal to generate corresponding filtered ac signals;
   demodulating each filtered ac signal to thereby generate for each respective ac signal a corresponding dc voltage representative of the magnitude and phase relative to the reference signal of the respective ac signal;
   digitizing each of the corresponding dc voltages to produce respective digital values; and
   processing the digital values to obtain a corresponding digital angular position value.

15. The method of claim 14 wherein the encoded signal is a synchro signal comprising three ac synchro signals.

16. The method of claim 14 wherein the encoded signal is a resolver signal comprising two ac resolver signals.

17. The method of claim 14 further comprising the step of low pass filtering each corresponding dc voltage prior to digitization.

18. The method of claim 17 wherein the step of demodulating comprises rectifying each respective ac signal to generate a respective rectified signal and inverting the rectified signal when the ac signal is 180° out of phase with the reference signal.

* * * * *